(12) United States Patent
Yu et al.

(10) Patent No.: US 10,923,448 B2
(45) Date of Patent: Feb. 16, 2021

(54) BOND PAD WITH MICRO-PROTRUSIONS FOR DIRECT METALLIC BONDING

(71) Applicant: Micron Technology, Inc., Boise, ID (US)

(72) Inventors: Aibin Yu, Singapore (SG); Wei Zhou, Singapore (SG); Zhaohui Ma, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/627,314

(22) Filed: Jun. 19, 2017

(65) Prior Publication Data
US 2017/0287864 A1  Oct. 5, 2017

Related U.S. Application Data

(62) Division of application No. 14/496,082, filed on Sep. 25, 2014, now abandoned.

(51) Int. Cl.
*H01L 23/00* (2006.01)
*H01L 23/48* (2006.01)
*H01L 21/768* (2006.01)

(52) U.S. Cl.
CPC ........ *H01L 24/14* (2013.01); *H01L 21/76898* (2013.01); *H01L 23/00* (2013.01); *H01L 23/481* (2013.01); *H01L 24/00* (2013.01); *H01L 24/03* (2013.01); *H01L 24/05* (2013.01); *H01L 24/08* (2013.01); *H01L 24/09* (2013.01); *H01L 24/13* (2013.01); *H01L 24/80* (2013.01); *H01L 24/81* (2013.01); *H01L 2224/03462* (2013.01); *H01L 2224/03464* (2013.01);
(Continued)

(58) Field of Classification Search
CPC ....... H01L 24/13; H01L 24/14; H01L 23/481; H01L 24/09; H01L 24/81; H01L 2224/1701; H01L 2924/01029
USPC .......................... 257/666, 737, 773, E23.015; 267/E23.174
See application file for complete search history.

(56) References Cited

U.S. PATENT DOCUMENTS 5,731,636 A * 3/1998 Chun ................... H05K 3/4007
257/734
6,313,540 B1   11/2001 Kida et al.
(Continued)

*Primary Examiner* — Robert T Huber
(74) *Attorney, Agent, or Firm* — Perkins Coie LLP

(57) ABSTRACT

A bond pad with micro-protrusions for direct metallic bonding. In one embodiment, a semiconductor device comprises a semiconductor substrate, a through-silicon via (TSV) extending through the semiconductor substrate, and a copper pad electrically connected to the TSV and having a coupling side. The semiconductor device further includes a copper element that projects away from the coupling side of the copper pad. In another embodiment, a bonded semiconductor assembly comprises a first semiconductor substrate with a first TSV and a first copper pad electrically coupled to the first TSV, wherein the first copper pad has a first coupling side. The bonded semiconductor assembly further comprises a second semiconductor substrate, opposite to the first semiconductor substrate, the second semiconductor substrate comprising a second copper pad having a second coupling side. A plurality of copper connecting elements extend between the first and second coupling sides of the first and second copper pads.

11 Claims, 8 Drawing Sheets

(52) U.S. Cl.
CPC ............ *H01L 2224/03616* (2013.01); *H01L 2224/05078* (2013.01); *H01L 2224/05552* (2013.01); *H01L 2224/05572* (2013.01); *H01L 2224/05624* (2013.01); *H01L 2224/05644* (2013.01); *H01L 2224/05647* (2013.01); *H01L 2224/08147* (2013.01); *H01L 2224/1701* (2013.01); *H01L 2224/80203* (2013.01); *H01L 2224/80357* (2013.01); *H01L 2224/80895* (2013.01); *H01L 2924/01029* (2013.01)

(56) References Cited

U.S. PATENT DOCUMENTS

| | | | |
|---|---|---|---|
| 6,531,384 B1 | 3/2003 | Kobayashi et al. | |
| 7,563,703 B2* | 7/2009 | Brun | H01L 23/49811 257/E21.479 |
| 7,952,206 B2* | 5/2011 | Bachman | H01L 24/03 257/737 |
| 8,563,403 B1 | 10/2013 | Farooq et al. | |
| 2004/0197979 A1 | 10/2004 | Jeong et al. | |
| 2005/0048772 A1 | 3/2005 | Pan et al. | |
| 2011/0050320 A1 | 3/2011 | Gillingham et al. | |
| 2012/0248623 A1* | 10/2012 | Li | |
| 2013/0026643 A1* | 1/2013 | England | H01L 21/561 257/774 |
| 2015/0262950 A1* | 9/2015 | Cate | H01L 21/00 257/737 |

\* cited by examiner

BOND PAD WITH MICRO-PROTRUSIONS FOR DIRECT METALLIC BONDING

CROSS-REFERENCE TO RELATED APPLICATIONS

This application is a divisional of U.S. application Ser. No. 14/496,082 filed Sep. 25, 2014, which is incorporated herein by reference.

TECHNICAL FIELD

The disclosed embodiments relate to semiconductor devices and more particularly to bond pads on semiconductor dies.

BACKGROUND

Bond pads are formed on semiconductor dies to provide electrical and mechanical connection between one semiconductor die and another. To minimize the footprint of semiconductor assemblies, multiple semiconductor dies can be vertically stacked on top of one another. The dies in such vertically-stacked packages can be interconnected either with through-silicon-vias (TSV) that are electrically connected to each other using direct metallic bonding in which the bond pads of one die are directly bonded to the bond pads of the other. Such direct metallic bonding can be performed die-to-die (D2D), die-to-wafer (D2W), or wafer-to-wafer (W2W).

Direct metallic bonding provides several benefits over conventional solder bonding and thermocompression bonding processes. For example, direct bonding enables a high density of vertical interconnects because it does not involve reflowing or fluxing of a metal. Direct bonding also provides better electrical and mechanical performance compared to solder bonding without the need for adhesive or underfill materials. Copper is of particular interest for such direct metallic bonding. Direct copper-copper bonding—for example direct bonding between a first copper bond pad and a second copper bond pad—achieves good mechanical, thermal, and electrical performance. Direct copper-copper bonding additionally reduces intermetallic and electrical migration concerns compared to solder-based bonding approaches. However, direct copper-copper bonding presents certain challenges. First, a good bond requires adequate inter-diffusion at the copper-copper interface, which in turn requires that the surface of each bond pad must be flat and very smooth (e.g., less than several nm roughness). Typically this requires the use of chemical-mechanical planarization (CMP). However, because copper is relatively soft and subject to "dishing" and oxide erosion during CMP processing, the requisite planarity and surface quality for direct copper-copper bonding are difficult to achieve. Additionally, a high bonding force is needed for direct copper bonding, and such high forces may damage the bond pads and possibly the TSVs or circuits underneath.

DETAILED DESCRIPTION

Specific details of several embodiments of semiconductor die assemblies having direct metal-metal bonds and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1-5.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
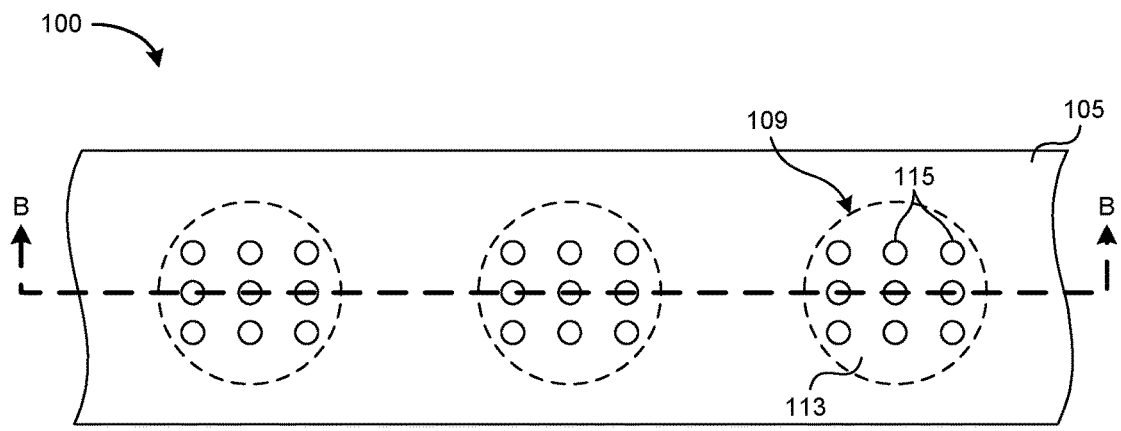
FIG. 1A is a top plan view illustrating a portion of a semiconductor die in accordance with embodiments of the present technology.
Figure 1B:
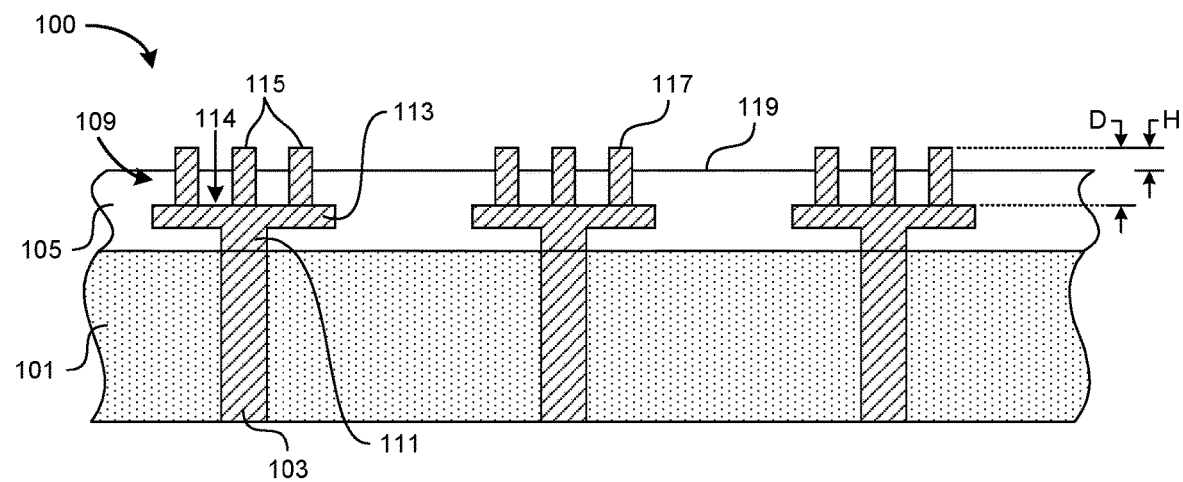
FIG. 1B is a cross-sectional view of the semiconductor die shown in FIG. 1A.

FIG. 1A is a top plan view illustrating a portion of a semiconductor die 100 in accordance with embodiments of the present technology, and FIG. 1B is a cross-sectional view of the semiconductor die 100 shown in FIG. 1A. Referring to FIG. 1B, the semiconductor die 100 can include a semiconductor substrate 101 having a plurality of through-silicon vias (TSVs) 103 formed through the substrate 101. The TSVs can be filled with a conductive material, for example a metal such as copper or aluminum. A dielectric material 105 is disposed over the upper surface of the semiconductor substrate 101. The dielectric material 105 may be silicon dioxide, though other dielectric materials may be used as well. Coupled to the upper end of the TSVs 103 is a bond pad 109. In the illustrated embodiment, the bond pad 109 includes a base 111 and a pad 113. The base 111 is often narrower than the pad 113, and the pad 113 defines a coupling side 114 of the bond pad 109. The bond pad 109 can be made of a conductive material, for example a metal such as copper or aluminum. The base 111 of the bond pad 109 is coupled to the TSV 103 to electrically connect the pad 113 with the TSV 103. In the illustrated embodiment, the base 111 of the bond pad 109 is disposed directly over the TSV 103, though in other embodiments they may be indirectly coupled to one another and need not be aligned. Referring to FIG. 1A, the pad 113 of the bond pad 109 has a substantially circular footprint in the illustrated embodiment, but in other embodiments the shape of the bond pad 109 may vary (e.g., rectangular, elliptical, etc.). The bond pads 109 are embedded in the dielectric material 105.

Referring back to FIG. 1A, the semiconductor die 100 can further include a plurality of bonding features or bonding elements, such as metallic elements 115, that project away from the coupling side 114 of the bond pads 109. The metallic elements 115 can project from the coupling side 114 by a distance "D". The metallic elements 115 may be made of copper, though in other embodiments the metallic elements 115 can be made of aluminum, gold, or other conductive metals. In the embodiment illustrated in FIGS. 1A and 1B, a plurality of the metallic elements 115 are separated from each other across each bond pad 109. In other embodiments, however, only a single metallic element 115 can project from the coupling side 114 of the bond pad 109. The thickness or width of the metallic elements 115 can vary in different embodiments, for example in some embodiments each metallic element has a width of between 0.5 and 5 microns. In other embodiments, each metallic element may have a width of between 0.1 and 0.5 microns, or between 5 microns and 10 microns or more. In some embodiments, each metallic element may be substantially identical in size and shape, while in other embodiments the individual metallic elements may vary in size or shape across a single bond pad.

As shown in FIG. 1B, the metallic elements 115 can have upper portions 117 that extend beyond the upper surface 119 of the dielectric material 105 by a height "H". In some embodiments, the height H is between about 0.5 microns and about 2 microns. In other embodiments, the height H may be between 0.1 and 0.5 microns, or between 2 microns and 10 microns or more. In the illustrated embodiment, the metallic elements 115 are pillars with a substantially cylindrical cross-section. In various embodiments, the metallic elements may take a variety of different shapes, as will be described in more detail below. The number and configuration of the metallic elements 115 may also vary. As illustrated, there may be nine metallic elements 115 for each bond pad 109. In various embodiments, there can be at least four metallic elements for each bond pad, or in some embodiments there can be over 100 metallic elements for each bond pad. Each metallic element 115 covers only a portion of the coupling side 114 of the bond pad 109, and collectively all the metallic elements 115 for each bond pad 109 cover only a portion of the bond pad 109 such that at least a portion of the coupling side 114 of the bond pad 109 does not have metallic elements disposed on it.

In traditional approaches to direct metal bonding, the entire surface area of the bond pads of adjacent semiconductor dies would be placed directly adjacent one another and bonded together, for example via thermocompression bonding or thermosonic bonding. This requires excellent surface quality and planarity of the upper surfaces of the bond pads, which is difficult to achieve when the bond pads are made of copper as described above. Additionally, the pressure applied to bond the two bond pads together can be so high that the underlying circuitry or the TSVs can be damaged. The embodiment of the semiconductor die 100 illustrated in FIGS. 1A-1B utilizes the metallic elements 115 to overcome these challenges. For example, referring to FIGS. 2A-2B, the upper portions 117 of the metallic elements 115 can deform as they are pressed against an adjacent bonding structure (e.g., another bond pad or other metallic elements) on another semiconductor die. The deformation of the upper portions 117 of the metallic elements 115 provides good direct metal-to-metal bonding between the metallic elements 115 and the adjacent bonding structure.

Several embodiments of the semiconductor die 100 shown in FIGS. 1A-1B are thus expected to reduce the pressure needed to bond the two components together without requiring stringent control of the surface quality and planarity of the bond pads. For example, traditional direct metal bonding can require an applied pressure on the order of 100 MPa. Typical solder-based bonding processes, however, can utilize an applied pressure of between about 14-20 MPa, or an applied force on the order of 100 N. Through the use of metallic elements as described herein, direct metal-to-metal bonding can be achieved with an applied pressure similar to that of solder-based bonding processes (e.g., between 14-20 MPa) or even less (e.g., less than 20 MPa, less than 15 MPa, or less than 10 MPa).

Figure 2A:
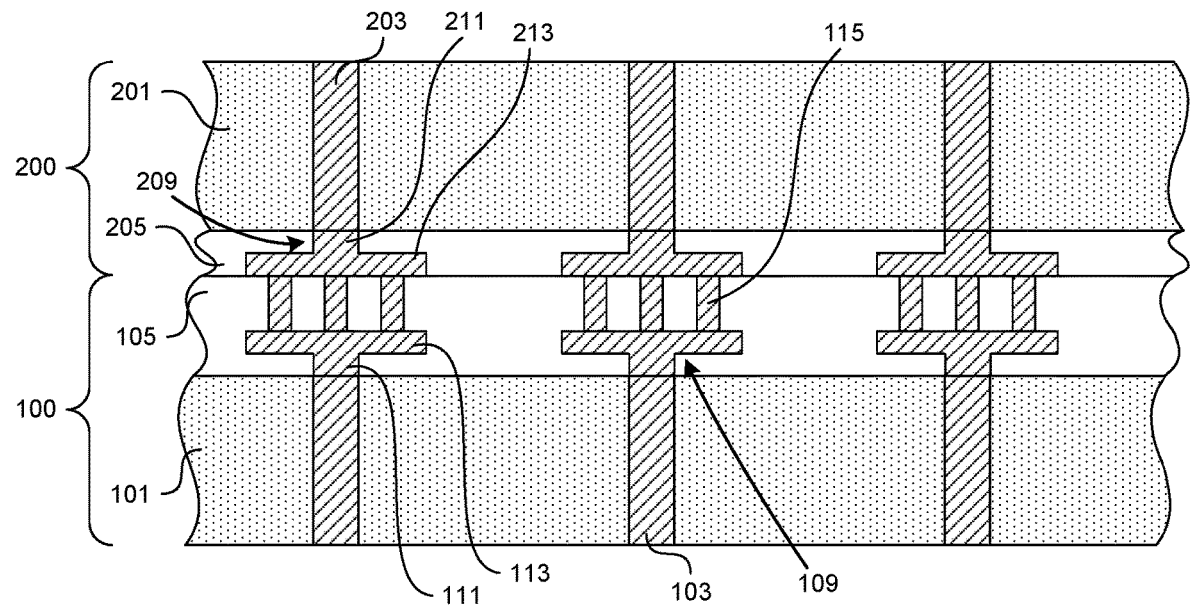
FIG. 2A is a cross-sectional view of a bonded semiconductor die assembly in accordance with embodiments of the technology.

FIG. 2A is a cross-sectional view of a bonded semiconductor die assembly in accordance with embodiments of the technology. The lower semiconductor die 100 is similar in structure to that described above with respect to FIGS. 1A-1B, while the upper semiconductor die 200 has a metallic bonding structure with no metallic elements projecting from the bond pad. The upper semiconductor die 200, for example, includes a semiconductor substrate 201 having TSVs 203 and bond pads 209 with bases 211 coupled to the TSVs 2013 and pads 213 that are wider than the bases 211. The semiconductor substrate 200 differs from the semiconductor substrate 100 in that the surface of the bond pads 209 of the upper semiconductor die 200 are substantially coplanar with the surrounding dielectric material 205 and no metallic elements project from the bond pads 209.

Referring still to FIG. 2A, the two semiconductor dies 100 and 200 are bonded together between the metallic elements 115 and the pads 213. Before bonding, the metallic elements 115 of the lower semiconductor die 100 would have projected beyond the dielectric material 105 by a distance H as shown in FIG. 1B. During the bonding process, the upper portions 117 (FIG. 1B) of the metallic elements 115 and the opposing pads 213 of the upper semiconductor die 200 are directly pressed together. As pressure and heat are applied, the upper portions 117 of the metallic elements 115 deform and fuse with the opposing pads 213. The resulting structure, illustrated in FIG. 2A, has good mechanical and electrical coupling between the bond pads 109 of the lower semiconductor die 100 with the bond pads 209 of the upper semiconductor die 200 via the metallic elements 115. As with FIGS. 1A-B, the metallic elements 115, the bond pads 109 and 209, and the TSVs 103 and 203 may be made of conductive metals such as copper, aluminum, or gold. In some embodiments, the metallic elements 115, the bond pads 109 and 209, and the TSVs 103 and 203 may all be made of the same material, while in other embodiments the materials used for any of these components may differ.

Figure 2B:
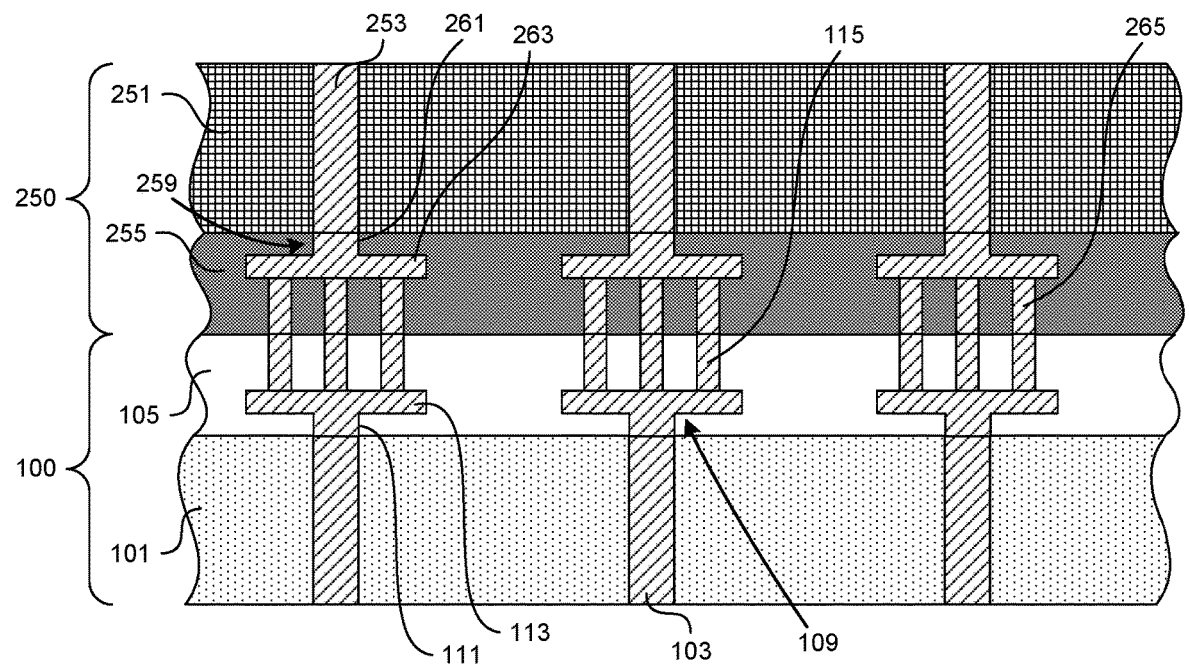
FIG. 2B is a cross-sectional view of another bonded semiconductor die assembly in accordance with embodiments of the technology.

FIG. 2B is a cross-sectional view of another bonded semiconductor die assembly in accordance with embodiments of the technology. The lower semiconductor die 100 is similar in structure to that described above with respect to FIGS. 1A-1B and 2A, while the upper semiconductor die 250 is a similar structure that has been inverted for bonding. The upper semiconductor die 250, for example, can include a semiconductor substrate 251 having TSVs 253 and bond pads 259 with bases 261 coupled to the TSV's 253 and pads 263. The upper semiconductor die 250 can further include metallic elements 265 that project from the pads 263 of the bond pads 259, and the metallic elements 265 can be substantially surrounded by the dielectric material 255. In one embodiment, the metallic elements 265 can have projecting portions that project beyond the dielectric material 255 in a manner similar to the upper portions 117 (FIG. 1B) of the lower semiconductor die 100. In other embodiments, the terminus of the metallic elements 265 can be coplanar or inset with respect to the outer surface of the dielectric material 255.

FIG. 2B illustrates the semiconductor dies 100 and 250 after they have been bonded together. Before bonding, the upper portions 117 of the metallic elements 115 of the lower semiconductor die 100 would have projected beyond the dielectric material 105 as shown in FIG. 1B, and similarly portions of the metallic elements 265 of the upper semiconductor die 250 may have projected beyond the dielectric material 205. During the bonding process, the upper portions 117 of the metallic extensions 115 and the portions of the metallic extensions 265 that project beyond the dielectric material 205 are pressed together. As pressure and heat are applied, these protruding portions of the metallic elements 115 and 265 deform and bond together. The resulting structure, illustrated in FIG. 2B, has good mechanical and electrical coupling between the bond pads 109 of the lower semiconductor die 100 and the bond pads 259 of the upper semiconductor die 250 via the metallic elements 115 and 265. As noted above, the metallic elements 115 and 265, the bond pads 109 and 259, and the TSVs 103 and 253 may be made of conductive metals such as copper, aluminum, or gold. In some embodiments, the metallic elements 115 and 265, the bond pads 109 and 259, and the TSVs 103 and 253 may all be made of the same material, while in other embodiments the materials used for any of these components may differ.

In the embodiment illustrated in FIG. 2B, the individual metallic elements 115 and 265 are substantially aligned with one another as they are pressed together. However, in other embodiments the elements need not be so precisely aligned. For example, the bond pads of the opposing semiconductor dies may be substantially aligned with one another, while the individual metallic elements are not precisely aligned with one another. When brought into contact, even if not precisely aligned, the outermost portions of the metallic elements can deform sufficiently so that the metallic elements bond together and form an adequate mechanical and electrical connection between the opposing bond pads.

Figure 3A:
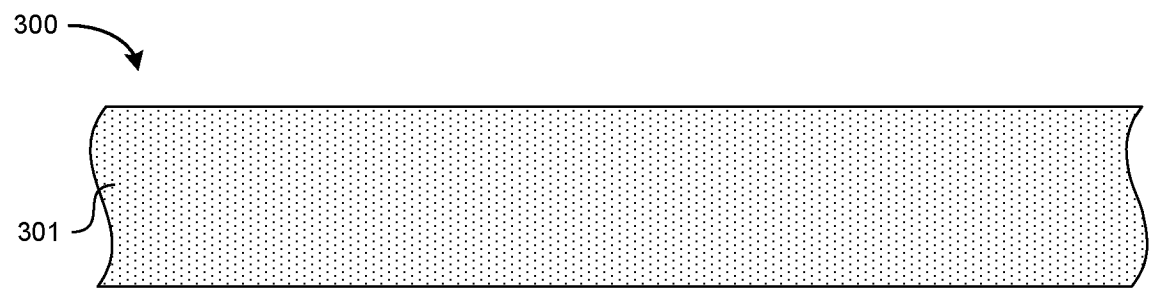
FIGS. 3A-3M are cross-sectional views illustrating a method of manufacturing a semiconductor die in accordance with embodiments of the technology.
Figure 3B:
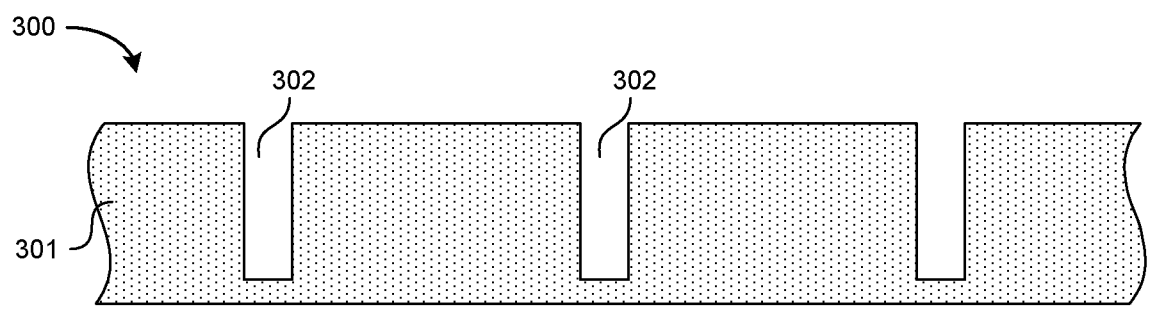

FIGS. 3A-3F are cross-sectional views illustrating a method of manufacturing a semiconductor die 300 in accordance with embodiments of the technology. Referring to FIG. 3A, a semiconductor substrate 301 is provided. FIG. 3B shows the semiconductor die 300 after a plurality of blind holes 302 have been formed. For example, the blind holes 302 can be etched into the semiconductor substrate 301 using deep reactive ion etching, laser drilling, or other suitable techniques.

Figure 3C:
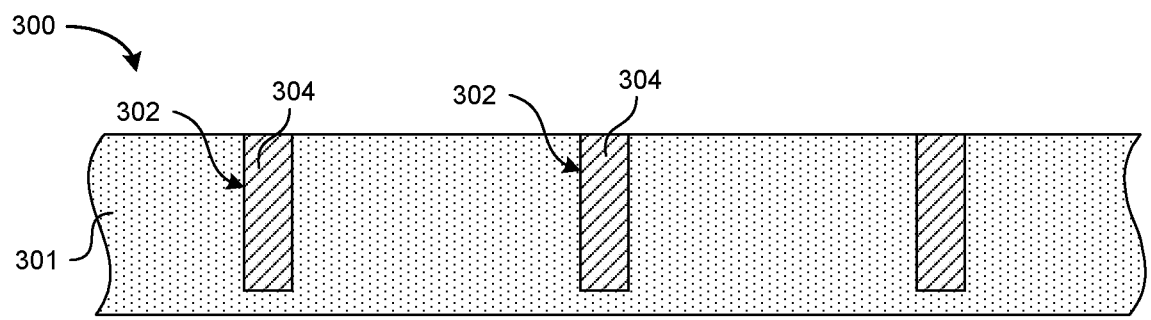
Figure 3D:
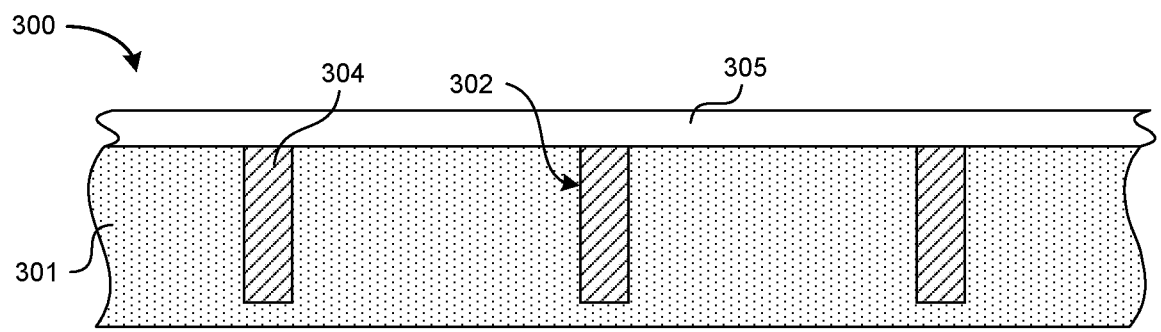

FIG. 3C illustrates the semiconductor die 300 after the blind holes 302 have been filled with a conductive material 304. In some embodiments, the conductive material 304 may be copper, which can be deposited into the blind holes 302 via electrochemical deposition (e.g., electroplating or electroless plating) or another suitable deposition technique. For example, electrochemical deposition processes can include depositing a barrier (not shown), one or more seed materials (not shown) on the barrier, and plating a bulk portion of the conductive material 304 onto the seed materials. After plating the bulk portion of the conductive material 304, the semiconductor die 300 is planarized to remove excess copper over the blind holes 302 and thereby electrically isolate the remaining conductive material 304 in the blind holes 302. FIG. 3D shows the semiconductor die 300 after a dielectric material 305 has been deposited over the semiconductor substrate 301 and the conductive material 304 remaining in the blind holes 302. The dielectric material 305 can be, for example, silicon dioxide deposited using chemical vapor deposition, physical vapor deposition, or other suitable methods.

Figure 3E:
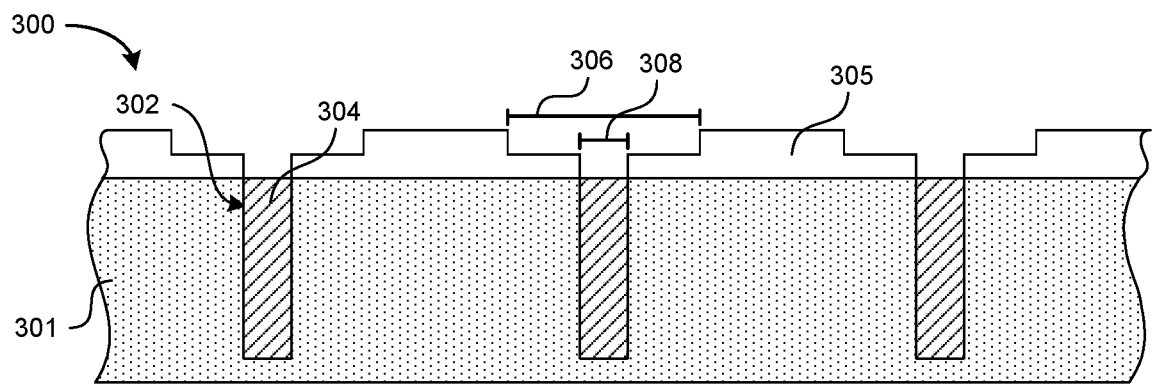

FIG. 3E illustrates the semiconductor die 300 after recesses 306 and vias 308 have been formed in the dielectric material 305. As illustrated, the recesses 306 define a wide openings extending only partially into the dielectric material 305 (e.g., the recesses 306 extend to only an intermediate depth of the dielectric material 305), while the vias 308 define a narrow openings which extend completely through the remaining dielectric material 305 under the recesses 306. Such a recess-and-via structure can be achieved, for example, by using a so-called "dual damascene" approach. As is known in the art, the dual damascene process can proceed by either defining the vias 308 first followed by the recesses 306, or in reverse order. In one example, photoresist and photolithography may be used to pattern the vias 308, followed by a partial etch into the dielectric material 305. Photoresist and photolithography may then again be used to define the recesses 306, followed by second etch of the exposed dielectric material. This second etch achieves a partial removal of the dielectric material in the recess-only regions, and a full etch of the dielectric material in the via region that results in the structure illustrated in FIG. 3E. The method noted here is only one example, and other approaches may be used to arrive at the same or similar structures.

Figure 3F:
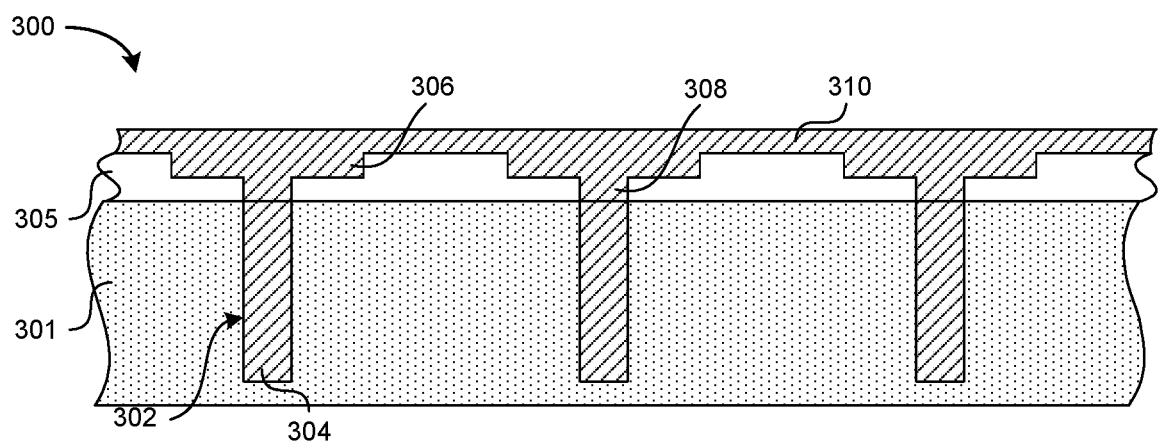

FIG. 3F shows the semiconductor die 300 after a conductive material 310 has been deposited over the dielectric material 305 to fill the recesses 306 and the vias 308. In some embodiments, the conductive material 310 may be copper that is deposited via electrochemical deposition (e.g., electroplating or electroless plating) as described above with reference to FIG. 3C. In some embodiments, the conductive material 310 may be the same material as conductive material 304 used to fill the blind holes 302. In other embodiments different materials may be used for the conductive material 310 and the conductive material 304.

Figure 3G:
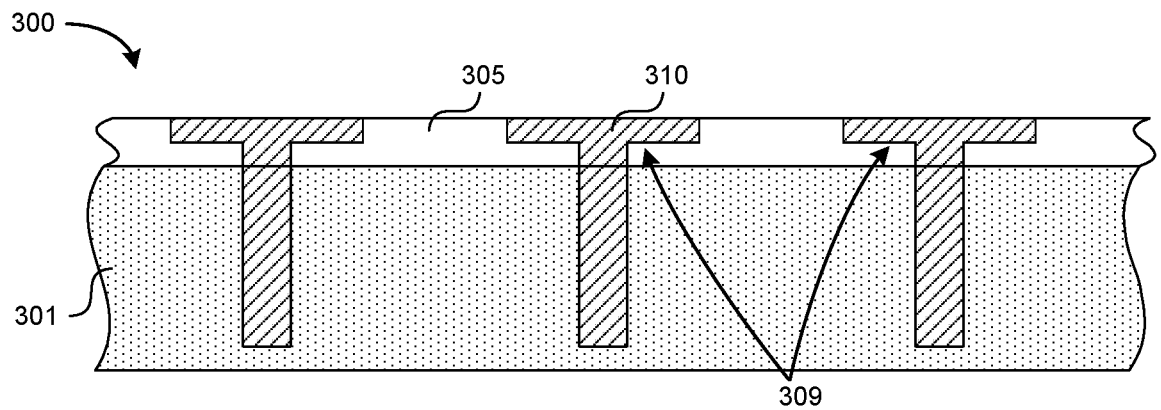

FIG. 3G illustrates the semiconductor die 300 after the excess portion of the deposited conductive material 310 has been removed so that the dielectric material 305 is exposed on the upper surface and the remaining portions of the conductive material 310 in the recesses 306 are electrically isolated from each other. Additionally, the surface of the dielectric material 305 is substantially co-planar with the upper surface of the remaining portions of the conductive material 310 in the recesses 306. The excess portions of the conductive material 310 can be removed using a CMP process, for example. As illustrated, the remaining portions of the conductive material 310 that fill the recesses 306 and vias 308 define bond pads 309 similar to that shown in FIGS. 1A-1B.

The structure illustrated in FIG. 3G is similar to traditional bond pad structures in which a TSV (to be defined by the blind hole 302) is metallized and coupled to a bond pad 309. The upper surface of the bond pad 309 is exposed and may be used for direct metal-to-metal bonding. However, as noted previously, such bonding requires very flat surfaces and excellent surface quality. Particularly in the case of copper, CMP processes used to move from the structure of FIG. 3F to that of FIG. 3G tend to "dish" and erode the top surfaces of the bond pads 309. The structure shown in FIG. 3G can be achieved using a variety of different approaches, and the particular processing steps set forth in FIGS. 3A-3G are only one possible approach. Other suitable approaches may be used as desired.

Figure 3H:
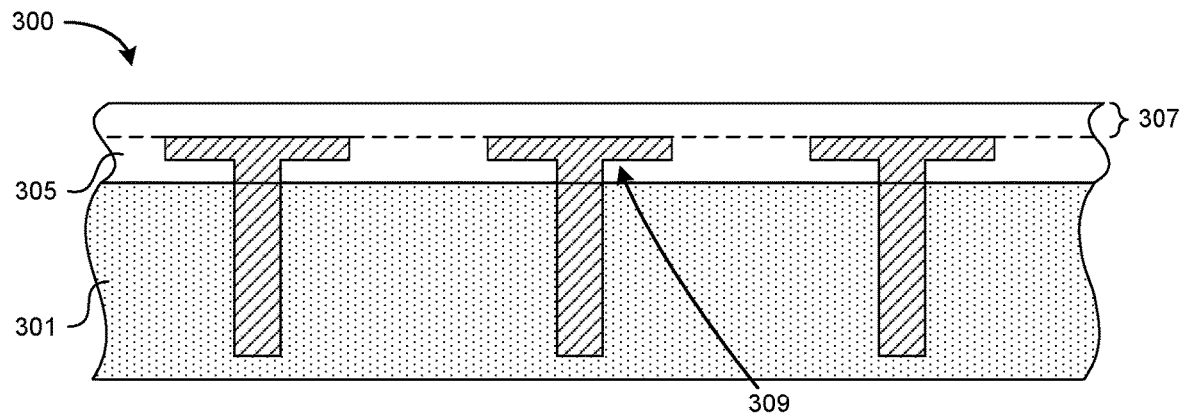
Figure 3I:
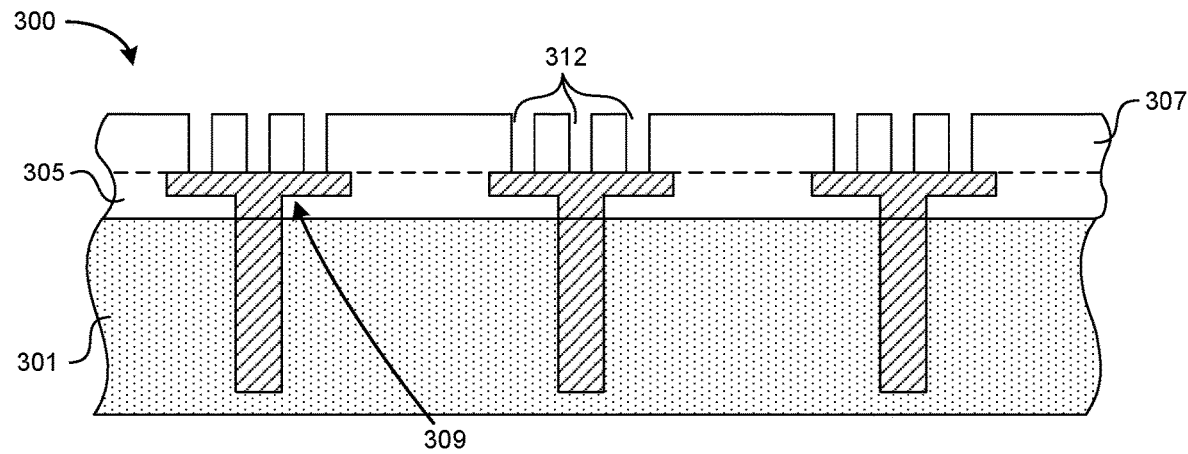

FIGS. 3H-3M illustrate a process to form at least one metallic element that projects from the bond pads 309 to overcome the challenges associated with the dishing and erosion caused by CMP processing. FIG. 3H shows the semiconductor die 300 after additional dielectric material 307 (shown by dashed lines above dielectric material 305) has been deposited over the dielectric material 305 and the bond pads 309. The additional dielectric material 307 can be, for example, silicon dioxide deposited using chemical vapor deposition, physical vapor deposition, or other suitable method. When the dielectric material 305 and the dielectric material 307 are the same, they can form a single homogeneous structure. The thickness of the additional dielectric material 307 at this stage can at least approximately define the final height of the resultant metallic elements. In some embodiments, the additional dielectric material may be deposited at a thickness that is 100%-200% of the width of the opening 312 (FIG. 3I). For example, in an embodiment in which the opening 312 has a width of 2 µm, the dielectric material 305 may be deposited to a thickness over the upper surface of the bond pads 309 of between 2 µm and 4 µm. In other embodiments, the dielectric material may be deposited at a thickness that is more than twice the width of the opening 312, or at a thickness that is less than the width of the opening 312.

FIG. 3I illustrates the semiconductor die 300 after a plurality of openings 312 have been formed through the additional dielectric material 307. The openings 312 can be formed using photolithography and etching processes that accurately position the openings 312 to expose desired portions of the bond pads 309. The openings 312 can be formed to define the size and configuration of the metallic elements. As described previously, the metallic elements can take the form of pillars, in which case the openings 312 can be at least substantially cylindrical. In other embodiments the metallic elements can have different cross-sectional shapes (e.g., rectangular, cross-shaped, polygonal, elliptical, irregular, etc.). The openings 312 can also be arranged in a variety of configurations over the bond pads 309. For example, the openings can be arranged in an array, grid, intersecting lines, or other patterns. Any number of openings 312 can be defined for each bond pad 309 at this stage. In some embodiments, a single opening may be defined over each bond pad, while in other embodiments there may be at least two openings, at least three openings, at least four openings, or more. In some embodiments, there may be over 100 openings formed over each bond pad. The openings 312 can accordingly be sized to provide the desired arrangement within the footprint of the individual bond pads 309. For example, the openings 312 can have a width of approximately 0.5-5 microns.

Figure 3J:
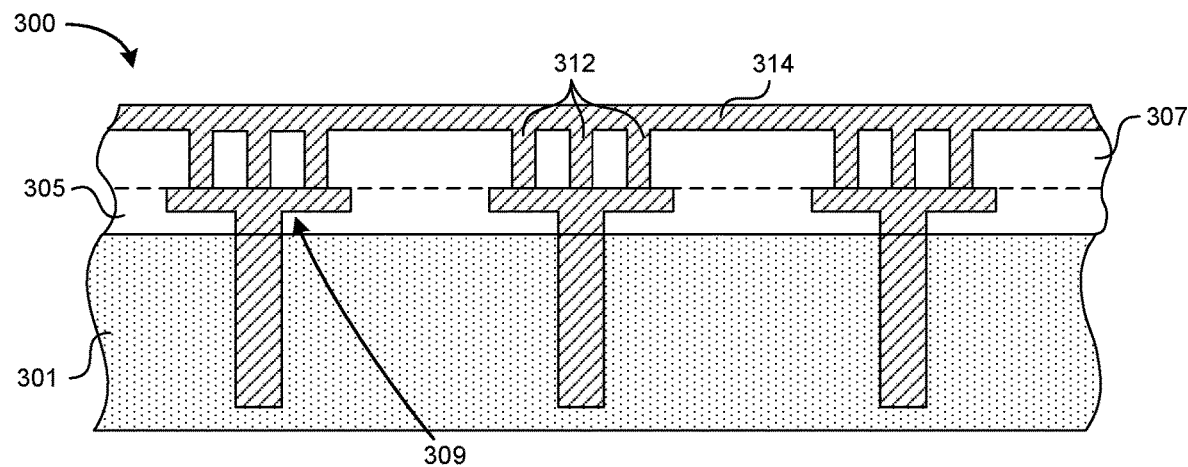

FIG. 3J illustrates the semiconductor die 300 after a bulk conductive material 314 has been deposited in a blanket layer over the semiconductor die 300 to fill the openings 312 over the bond pads 309. In some embodiments, the bulk conductive material 314 may be copper, which can be deposited using electrochemical deposition (e.g., electroplating or electroless plating) or other suitable techniques. In some embodiments, the conductive material 314 may be the same material as conductive material 304 (filling blind holes 302) and/or the conductive material 310 (defining bond pads 309). In other embodiments different materials may be used.

Figure 3K:
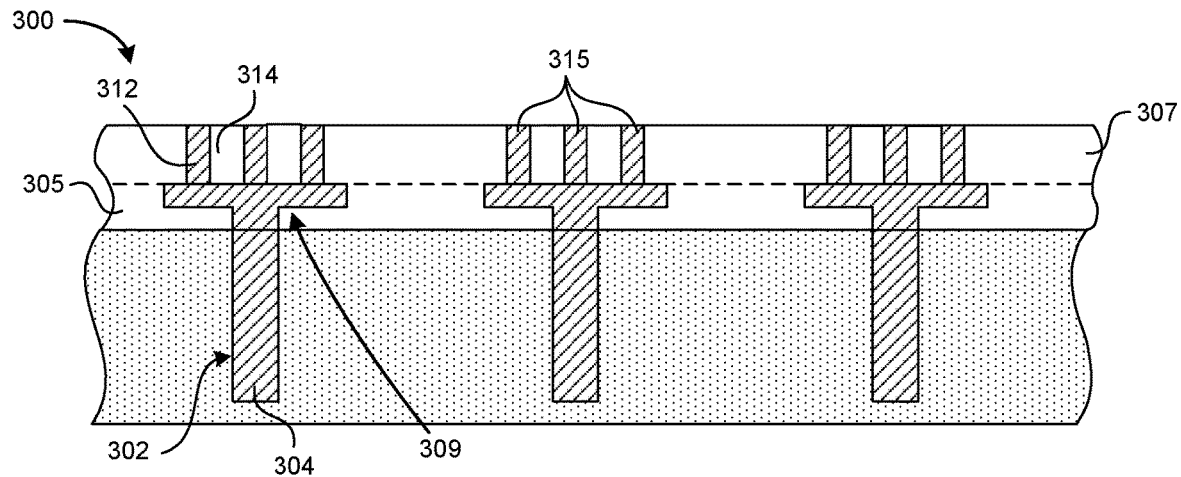

FIG. 3K illustrates the semiconductor die 300 after the excess portion of the bulk conductive material 314 has been removed so that the surface of the additional dielectric material 307 is exposed and is substantially co-planar with the upper surface of the remaining conductive material 314 disposed within the openings 312. The excess portion of the bulk conductive material 314, for example, can be removed using a suitable CMP process. As illustrated, the remaining conductive material 314 in the openings 312 defines a plurality of metallic elements 315 similar to those shown in FIGS. 1A-1B. As opposed to the bond pads 309 shown in FIG. 3G, the upper surfaces of the metallic elements 315 are less subject to dishing because the diameter or other cross-sectional dimension of the metallic elements 315 is substantially less than that of the surface of the bond pads 309.

Figure 3L:
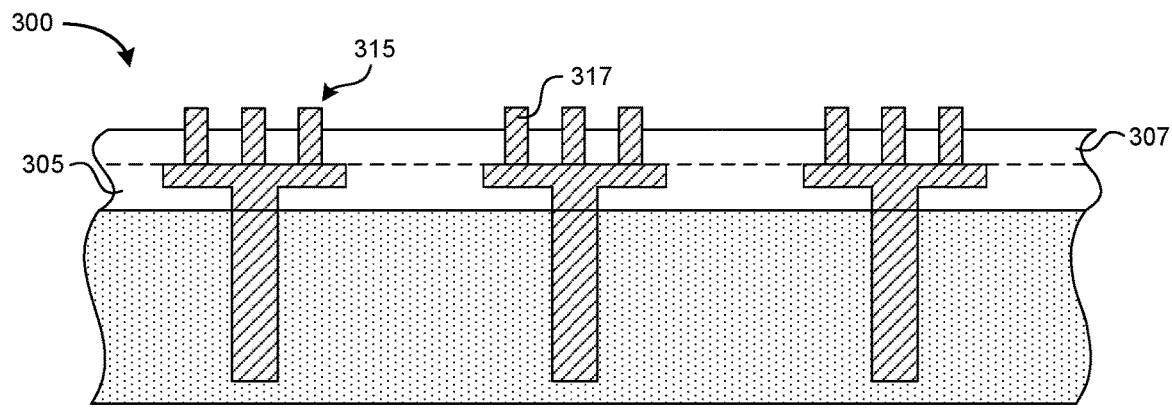

FIG. 3L shows an optional process in which a portion of the additional dielectric material 307 is etched back to expose upper portions 317 of the metallic elements 315. The dielectric material 307 can be etched back using any number of techniques, such as reactive ion etching or plasma etching. The depth of this etching step defines the extent to which the upper portions 317 of the metallic elements 315 project beyond the dielectric material 307 in the resulting structure. In some embodiments, the upper portions 317 of the metallic elements 315 can project beyond the surface of the dielectric material 307 by approximately 0.5-2 microns.

Figure 3M:
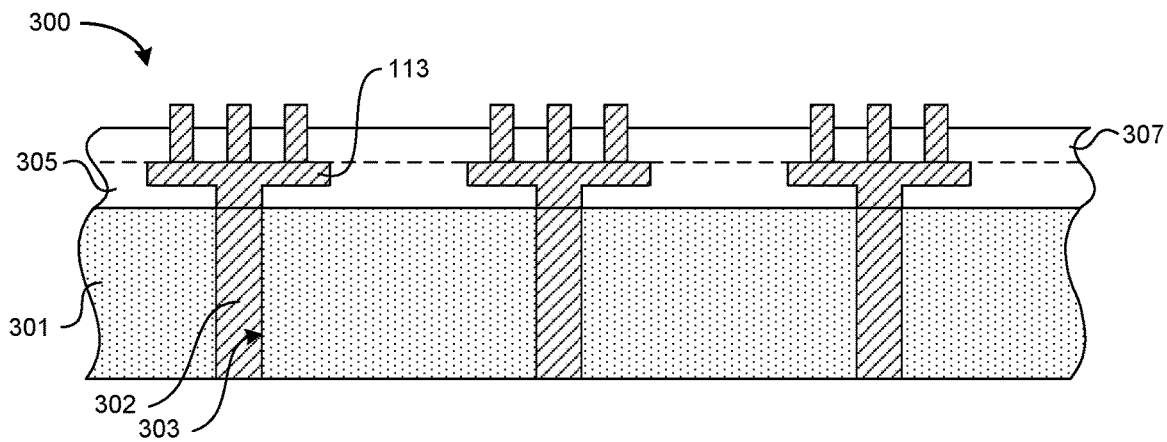

FIG. 3M shows the semiconductor die after a portion of the backside of the semiconductor substrate 301 has been removed to expose the conductive material 304 in the blind holes 302 and thereby define the TSVs 303. Thinning of the semiconductor substrate 301 can be accomplished using wafer backgrinding, for example. The above processes shown in 3A-3M can be performed at the wafer level, followed by dicing of the wafer into individual semiconductor dies.

Figure 4A:
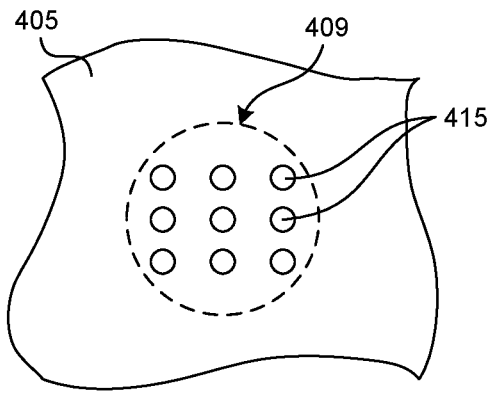
FIGS. 4A-4C illustrate top plan views of various embodiments of a semiconductor die in accordance with embodiments of the present technology.
Figure 4B:
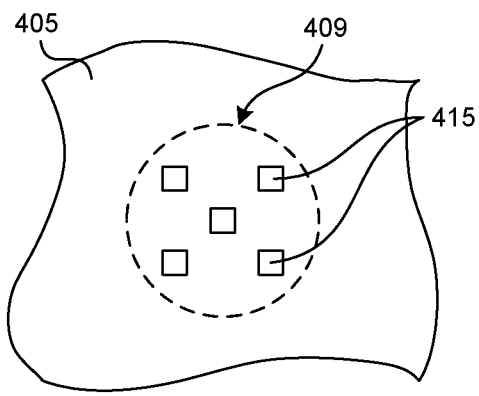
Figure 4C:
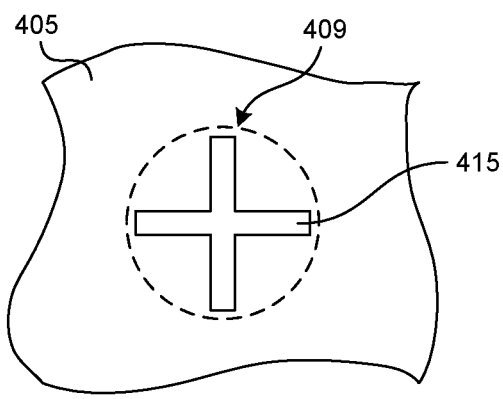

FIGS. 4A-4C illustrate top plan views of various embodiments of a semiconductor die in accordance with embodiments of the present technology. In each of FIGS. 4A-4C, one or more metallic elements 415 are arranged over a bond pad 409, and the metallic elements 415 can project beyond the dielectric material 405. The metallic element(s) 415 can have a number of different shapes and configurations. For example, in FIG. 4A, the metallic elements 415 are arranged in a 3×3 array of substantially cylindrical pillars. In FIG. 4B, five individual metallic elements 415 have rectangular cross-sections and are arranged around four corners with an additional central metallic element 415. In FIG. 4C, a single metallic element 415 has a raised cross pattern. Various other patterns and configurations of the metallic element(s) may be used, including any configuration in which the metallic elements cover only a part of the underlying bond pad. In such configurations, the pressure required to deform the metallic elements can be lower than that required to deform the underlying bond pad. As a result, during the bonding process less pressure can be applied and damage to underlying structures can be avoided.

Figure 5:
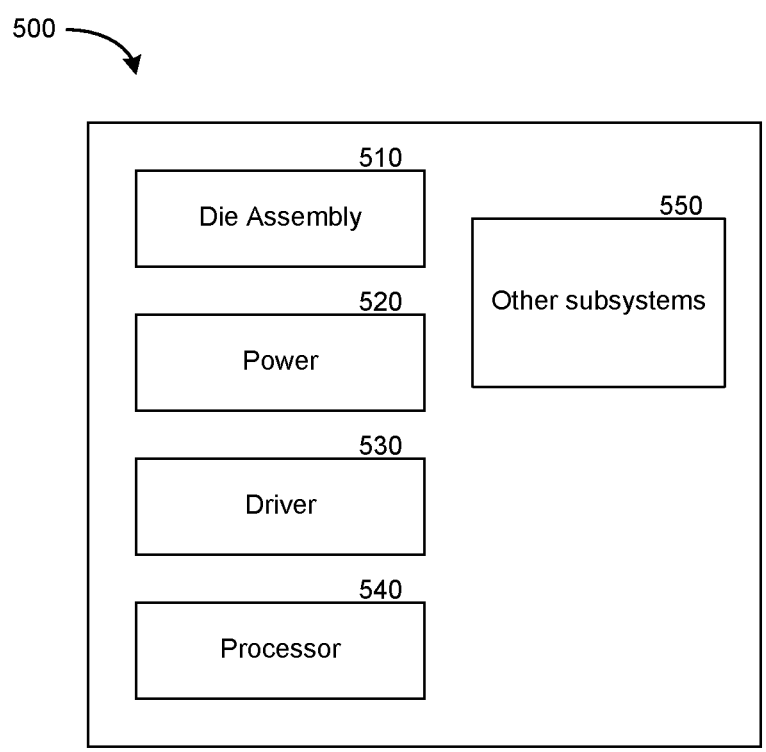
FIG. 5 is a schematic view of a system that includes a semiconductor die assembly configured in accordance with embodiments of the present technology.

Any one of the semiconductor dies described above with reference to FIGS. 1-4 can be incorporated into any of a myriad of larger and/or more complex systems, a representative example of which is system 500 shown schematically in FIG. 5. The system 500 can include a semiconductor die assembly 510, a power source 520, a driver 530, a processor 540, and/or other subsystems or components 550. The semiconductor die assembly 510 can include features generally similar to those of the stacked semiconductor die assemblies described above, and can therefore include a plurality of copper-copper joints having improved electrical and mechanical performance. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer-readable media.

From the foregoing, it will be appreciated that specific embodiments of the invention have been described herein for purposes of illustration, but that various modifications may be made without deviating from the disclosure. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A bonded semiconductor assembly comprising:
   a first semiconductor substrate comprising a first through-silicon via (TSV) and a first copper pad electrically coupled to the first TSV, wherein the first copper pad has a first coupling side;
   a second semiconductor substrate opposite to the first substrate, the second semiconductor substrate comprising a second copper pad having a second coupling side;
   a plurality of copper connecting elements, each copper connecting element physically contacting the first coupling side of the first copper pad and physically contacting the second coupling side of the second copper pad; and
   a single homogenous structure of dielectric material at least partially underlying the first copper pad, at least partially overlying the first copper pad, and surrounding and physically contacting each of the plurality of copper connecting elements.

2. The bonded semiconductor assembly of claim 1, wherein the first TSV comprises copper.

3. The bonded semiconductor assembly of claim 1, wherein the plurality of copper connecting elements comprise pillars.

4. The bonded semiconductor assembly of claim 1, wherein the plurality of copper connecting elements comprise at least four copper connecting elements.

5. The bonded semiconductor assembly of claim 1, wherein the plurality of copper connecting elements each has a cross-sectional dimension of between 0.5 and 5 microns.

6. The bonded semiconductor assembly of claim 1, wherein each of the plurality of copper connecting elements is in electrical communication with both the first and second copper pads.

7. The bonded semiconductor assembly of claim 1, wherein each copper connecting element is configured to deform at an upper portion thereof to provide direct metal-to-metal bonding between the upper portion thereof and the second coupling side of the second copper pad.

8. A semiconductor device, comprising:
   a first semiconductor substrate having a first through-silicon via (TSV), a first pad electrically coupled to the first TSV, a first bonding feature physically contacting and projecting away from the first pad, wherein the first bonding feature covers only a first portion of the first pad, and a second bonding feature physically contacting and projecting away from the first pad, wherein the second bonding feature covers only a second portion of the first pad;
   a second semiconductor substrate having a second TSV and a second pad electrically coupled to the second TSV; and
   a single homogenous structure of dielectric material disposed at least partially under the first pad between the first pad and the second pad, and surrounding and physically contacting each of the first bonding feature and the second bonding feature,
   wherein each of the first bonding feature and the second bonding feature is directly physically connected to the second pad by a metal-to-metal bond.

9. The semiconductor device of claim 8, wherein the first and second pads each comprises copper, and wherein the first and second bonding features comprise copper.

10. The semiconductor device of claim 8, wherein the first and second bonding feature each has a cross-sectional dimension of between 0.5 and 5 microns.

11. The semiconductor device of claim 8, wherein each of the first bonding feature and the second bonding feature is configured to deform at an upper portion thereof to provide the metal-to-metal bond between the upper portion thereof and the second pad.

* * * * *